(12) United States Patent
Cypher

(10) Patent No.: US 7,533,218 B2
(45) Date of Patent: May 12, 2009

(54) MEMORY SYSTEM TOPOLOGY

(75) Inventor: Robert E. Cypher, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 512 days.

(21) Appl. No.: 10/989,577

(22) Filed: Nov. 16, 2004

(65) Prior Publication Data
US 2006/0083043 A1     Apr. 20, 2006

Related U.S. Application Data

(60) Provisional application No. 60/520,759, filed on Nov. 17, 2003.

(51) Int. Cl.
*G06F 13/00* (2006.01)
(52) U.S. Cl. ...................... 711/115; 710/100
(58) Field of Classification Search .................. None
See application file for complete search history.

(56) References Cited

U.S. PATENT DOCUMENTS

| | | | |
|---|---|---|---|
| 6,502,161 B1 | 12/2002 | Perego et al. | 711/5 |
| 6,725,314 B1 | 4/2004 | Dong | 710/305 |
| 6,882,082 B2 | 4/2005 | Greeff et al. | 310/307 |
| 7,124,270 B2* | 10/2006 | Dillon et al. | 711/167 |
| 7,165,153 B2* | 1/2007 | Vogt | 711/154 |
| 7,206,897 B2* | 4/2007 | Perego et al. | 711/105 |
| 2003/0061447 A1 | 3/2003 | Perego | 711/113 |
| 2005/0105350 A1* | 5/2005 | Zimmerman | 365/201 |
| 2006/0020740 A1 | 1/2006 | Bartley et al. | |

FOREIGN PATENT DOCUMENTS

| | | |
|---|---|---|
| GB | 2 416 056 A | 1/2006 |
| WO | WO 2004/109528 A3 | 12/2004 |
| WO | WO 2005/066965 A2 | 7/2005 |

OTHER PUBLICATIONS

Combined Search and Examination Report Under Section 17 and 18 (3) for GB0523362.2, mailed Feb. 21, 2006.
Fully Buffered DIMM (FB-DIMM) Server Memory Architecture: Capacity, Performance, Reliability and Longevity-Feb. 18, 2004- Retrieved from http://www.idt.com/content/OSA_FB-DIMM-arch.pdf VOGT-Note connections of FB-DIMM's on p. 9.

* cited by examiner

*Primary Examiner*—Denise Tran
(74) *Attorney, Agent, or Firm*—Meyertons Hood Kivlin Kowert & Goetzel, P.C.; Rory D. Rankin

(57) ABSTRACT

A memory subsystem. A memory subsystem includes a memory controller coupled to a processor and a plurality of N memory modules. The memory controller is directly coupled to convey information to the Nth memory module through a downstream link, and is directly coupled to receive information from a first memory module through an upstream link. Each of the memory modules may be coupled to a prior memory module via a downstream link. Information conveyed from the memory controller to a particular memory module is conveyed to the Nth memory module through the downstream link and, as necessary, through additional downstream links to the particular memory module. Each of the memory modules may be coupled to receive data from a subsequent memory module via an upstream link. Information conveyed from a memory module to the memory controller is conveyed from the memory module through upstream links to the memory controller.

20 Claims, 6 Drawing Sheets

MEMORY SYSTEM TOPOLOGY

CROSS REFERENCE TO RELATED APPLICATIONS

This application claims benefit of priority to Provisional Application Ser. No. 60/520,759 filed Nov. 17, 2003.

BACKGROUND OF THE INVENTION

1. Field of the Invention

This invention relates to memory subsystems and, more particularly, to the topology of a memory system architecture.

2. Description of the Related Art

Over the years, demands placed upon computing systems have increased. As demands increase and technology has advanced, efforts have been made to both increase the capacity of memory systems and reduce memory system latencies. In recent years, proposals have been made for fully-buffered dual-inline memory modules (FB-DIMMs). Traditionally, DIMMs have been configured to buffer both addresses and commands, but the data interface itself has been unbuffered. For a variety of reasons, including loading considerations, such designs have been unable to provide sufficiently high data rates when multiple DIMMs are placed on the same data channel. As a result, DIMMs that buffer data (i.e., FB-DIMMS), as well as addresses and commands, have been proposed. One such proposal includes a buffer chip on each DIMM and uses high-speed unidirectional point-to-point signaling between the memory controller and between DIMMs.

FIG. 1 (prior art) illustrates one embodiment of such a proposal which is being authored by the Joint Electron Device Engineering Council (JEDEC). Among other things, the proposal concerns FB-DIMMs which offer greater capacity, including scalability of up to 192 GB, and as many as six channels and eight DIMMs per channel. In the example shown, a system 100 is depicted which includes a processing unit 110, a host 120, and memory modules 130A, 130B, 130C, 130D, 130E, 130F. Each of the memory modules 130 are FB-DIMMs 130 and are configured on a channel 156 from the host 120 (e.g., a memory controller) which is in turn coupled to a processing unit 110. Elements referred to herein with a particular reference number followed by a letter will be collectively referred to by the reference number alone. For example, memory modules 130A-130F may be collectively referred to as memory modules 130. In addition, each of the FB-DIMMs 130A-130F includes an advanced memory buffer (AMB) 150A-150F, respectively. Each AMB 150 on the channel 156 must be uniquely identifiable to be addressable by the system.

A first FB-DIMM 130A is coupled to the host 120 by two separate links (160, 170). The first of these links 160 may be referred to as a "downstream" or "southbound" link, in which the first FB-DIMM 130A receives data and/or commands from host 120. The second of these links 170 may be referred to as an "upstream" or "northbound" link, by which data is conveyed from FB-DIMMs 130 to host 120. The remainder of the FB-DIMMs 130 in the embodiment shown are coupled to each other through a plurality of upstream and downstream links as illustrated. In general, a link may be referred to as an upstream link if information conveyed through the link is flowing towards the host 120, while a link may be referred to as a downstream link if information conveyed through the link is flowing away from host 120. The FB-DIMMs 130 are coupled to each other in what is commonly referred to as a "daisy-chain" arrangement.

Generally speaking, downstream communication takes place by sending fixed-size frames on the downstream links, with each frame being sent to each FB-DIMM 130 in turn. These downstream frames are generally pipelined one after another without any gaps. The content of all downstream frames is conveyed from the host 120. Upstream communication takes place by sending a pipelined sequence of fixed-size frames on the upstream links. The content of upstream frames may be updated by FB-DIMMs 130 as they are forwarded by them. All read and write commands, as well as write data, are sent on the downstream links. All read data is sent on the upstream links.

Scheduling of reads and writes is performed by host/memory controller 120. In order to simplify the scheduling, all read data is returned in the order in which it was requested. Thus, data read from a particular FB-DIMM 130 is placed in the first available upstream frame following the availability of the data, while data read from the first FB-DIMM 130A is delayed until the appropriate upstream frame passes it. Each FB-DIMM 130 knows the required latency from when it receives the downstream read command to when it inserts the corresponding read data into an upstream packet (these latencies must be deterministic; they are proposed to be configured during power-on of the channel, although there are questions about the deterministic nature of this initialization scheme). For example, if the propagation delay from one FB-DIMM to another is D ns and the latency for reading data on an FB-DIMM is R ns, and if there are no delays due to framing alignments, the Nth FB-DIMM from the host 120 would provide its read data R ns after receiving its command and the FB-DIMM nearest to the host would insert its read data into a frame R+2*(N−1)*D ns after receiving its command. In general, regardless of which FB-DIMM 130 is being read, the corresponding read data would arrive at the host 120 R+2*N*D ns after the command was sent out. Example values of N may typically vary from 1 to 8 or 16 and typical values of D may be in the range of 2 ns.

While the above scheme may provide a simple means for scheduling read data, it may also suffer from potentially high latencies when N is large (e.g. 8 or 16). In addition, in order to deal with such latencies, it may also require buffering on each FB-DIMM 20. Further, it has inefficiencies related to scheduling frames for the read commands and the read data.

In view of the above, an effective and efficient memory architecture is desired.

SUMMARY OF THE INVENTION

A memory subsystem is contemplated. In one embodiment, a memory subsystem includes a memory controller which is coupled to a processor and a plurality of N memory modules. The memory controller is directly coupled to convey information to the Nth memory module through a downstream link. In addition, the memory controller is directly coupled to receive information from a first memory module through an upstream link.

In one embodiment, the Nth memory module is coupled to a prior memory module (i.e., memory module N−1) via a downstream link. Similarly, each of the remaining memory modules are coupled to a prior memory module via a downstream link. Any information sent from the memory controller to a particular memory module is conveyed first to the Nth memory module through the downstream link and, if necessary, through additional downstream links to the particular memory module.

In addition, the first memory module is coupled to receive data from a second memory module via an upstream link. The second memory module may be coupled to a third memory module by an upstream link, and each of the remaining memory modules, up to the (N−1)th memory module in the memory subsystem, may be coupled to receive data from a subsequent memory module by an upstream link. Any information to be conveyed from a memory module to the memory controller is conveyed from the memory module through upstream links to the memory controller.

These and other aspects of the invention will become apparent upon reading the following detailed description and upon reference to the accompanying drawings.

Figure 1:
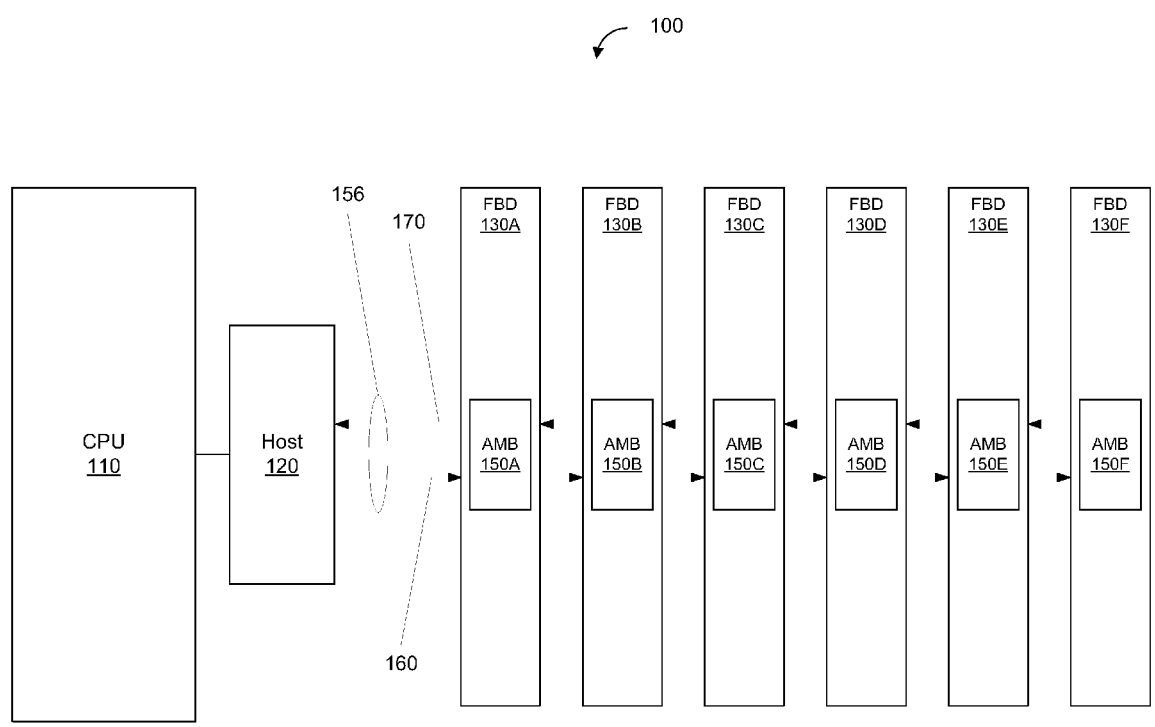
FIG. 1 (Prior Art) is a block diagram of one embodiment of a memory subsystem.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
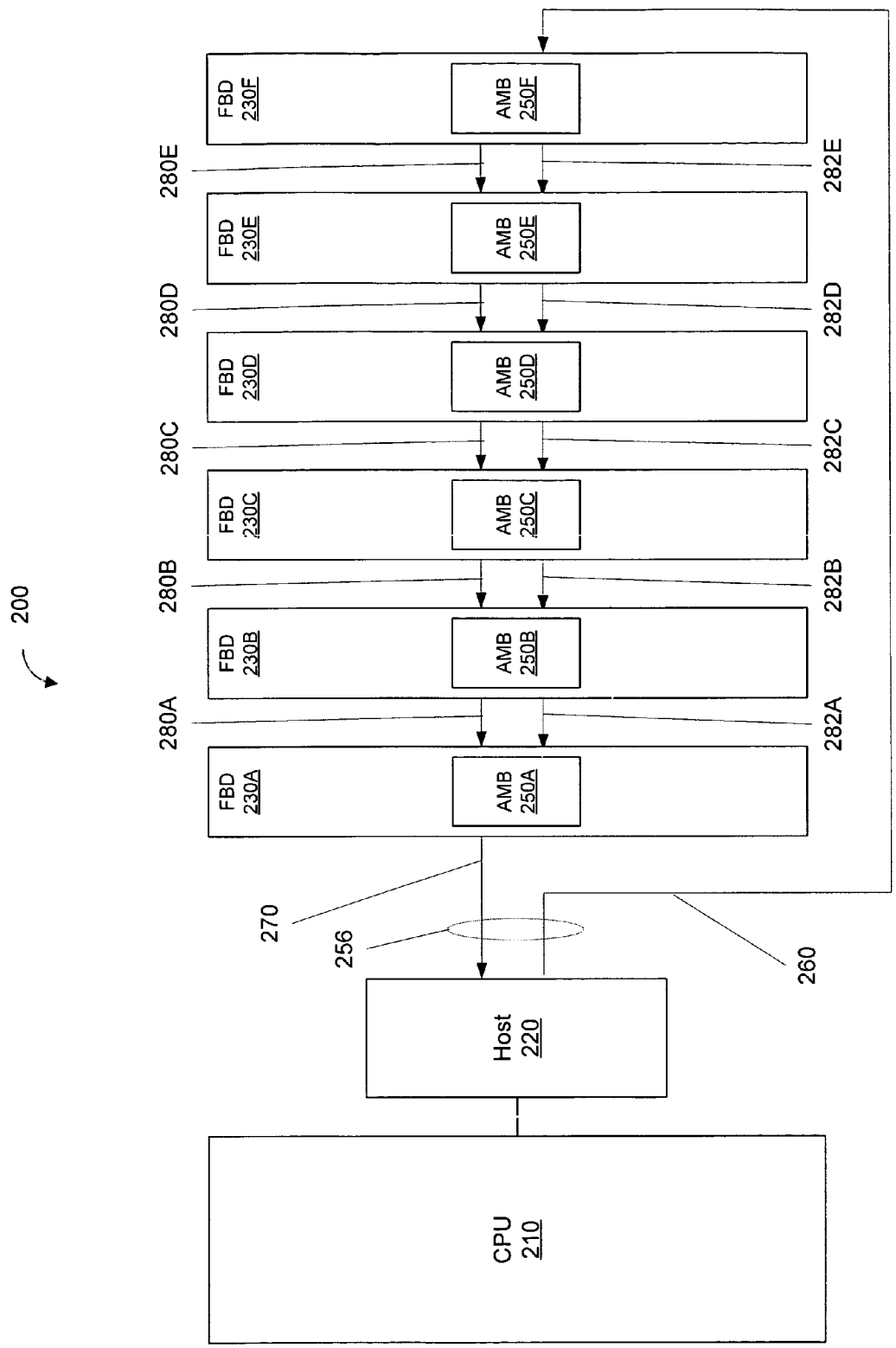
FIG. 2 is a block diagram of one embodiment of a memory subsystem.

Turning now to FIG. 2, one embodiment of a memory subsystem 200 is shown. System 200 includes a CPU 210, host 220, and multiple devices 230A-230F. In one embodiment, devices 230 comprise FB-DIMMS. However, other embodiments may utilize other types of memory modules. In addition, each of FB-DIMMS 230 further include an advanced memory buffer (AMB) 250A-250F, respectively. As in FIG. 1, each of FB-DIMMS 230 may include one or more random access memory chips (e.g., DRAM chips). In the example shown, CPU 210 is coupled to host 220 which may comprise a memory controller. Similar to the example of FIG. 1, host 220 is coupled to devices 230 via a channel 256 which includes an upstream link 270 and a downstream link 260. In addition, devices 230 are also shown coupled to one another via upstream and downstream links and may be configured to communicate via a protocol as described in the proposed JEDEC standard. In one embodiment, host 220 may be further coupled to each of the devices 230 via a system management bus (not shown) which may be utilized to configure operation of each of the devices 230. Alternatively, configuration of each of the devices 230 may be accomplished via channel 256.

In contrast to the example of FIG. 1, host 220 is not directly coupled to the first FB-DIMM 230A via downstream link 260. Rather, host 220 is coupled to the last FB-DIMM 230F via downstream link 260. Each FB-DIMM is then coupled to a preceding (i.e., an FB-DIMM closer to host 220) FB-DIMM via both an upstream (280A-280E) and downstream (282A-282E) link. As in FIG. 1, information may be received by host 220 through the upstream link 270 to which it is coupled. Information is conveyed from the host 220 to the last FB-DIMM 230F via the downstream link 260. Information conveyed from the host 220 to any of the remaining FB-DIMMs 220 is conveyed through the downstream link 260 and any intervening upstream links 280.

In one embodiment, each of the FB-DIMMS 230 includes a request decoder (not shown). When a request is conveyed by host 220, it passes through the downstream link 260 to the last FB-DIMM 230F in the chain, and may subsequently pass through other FB-DIMMs in the chain. For each FB-DIMM 230 that the request is conveyed to, the FB-DIMM's request decoder determines whether the request is targeted to memory (e.g., DRAM) on that particular module. If the request is targeted to memory on that particular module, the request will be serviced, and data (e.g., data read from one or more of the DRAMs on the module wherein the request is a read command) may be conveyed upstream to the host 220. If the request is not targeted to memory on that particular memory module, the request is conveyed through an upstream link 280 to the previous memory module in the chain (e.g., from the $3^{rd}$ FB-DIMM 230C to the $2^{nd}$ FB-DIMM 230B in the chain).

Each of the FB-DIMMs 230 encounter downstream frames in a different direction than that of the example in FIG. 1. As a result of this ordering for the embodiment shown, if each frame is delayed D ns when being propagated from one FB-DIMM to another, the total read latency will generally be the read access latency (R) for the module being read+the number of modules N*the propagation delay D ns, or R+N*D ns. In FIG. 1, the read latency was R+2*N*D. Accordingly, by utilizing the approach in FIG. 2, a reduction in latency of N*D ns in comparison to the embodiment shown in FIG. 1 may be achieved. As a result of this latency reduction, the buffering required per FB-DIMM 230 may be reduced.

Furthermore, assuming the approach in FIG. 2 and an equal propagation delay between each pair of FB-DIMMs, the delay from when a read command reaches a particular FB-DIMM to when the receiving FB-DIMM returns the read data is the same for all FB-DIMMs. As a result, read commands to different FB-DIMMs that return in different frames are necessarily in different downstream frames and cannot conflict with one another. Accordingly, bandwidth utilization of the channel may be improved. While bandwidth utilization may be aided by having substantially equal delays between pairs of adjacent FB-DIMMs, the delay between two FB-DIMMs i and i+1 could differ from that between two other FB-DIMMs j and j+1, (wherein i is not equal to j). However, as long as both the upstream and downstream links between FB-DIMMs i and i+1 were equal, bandwidth may be fully utilized.

Figure 3:
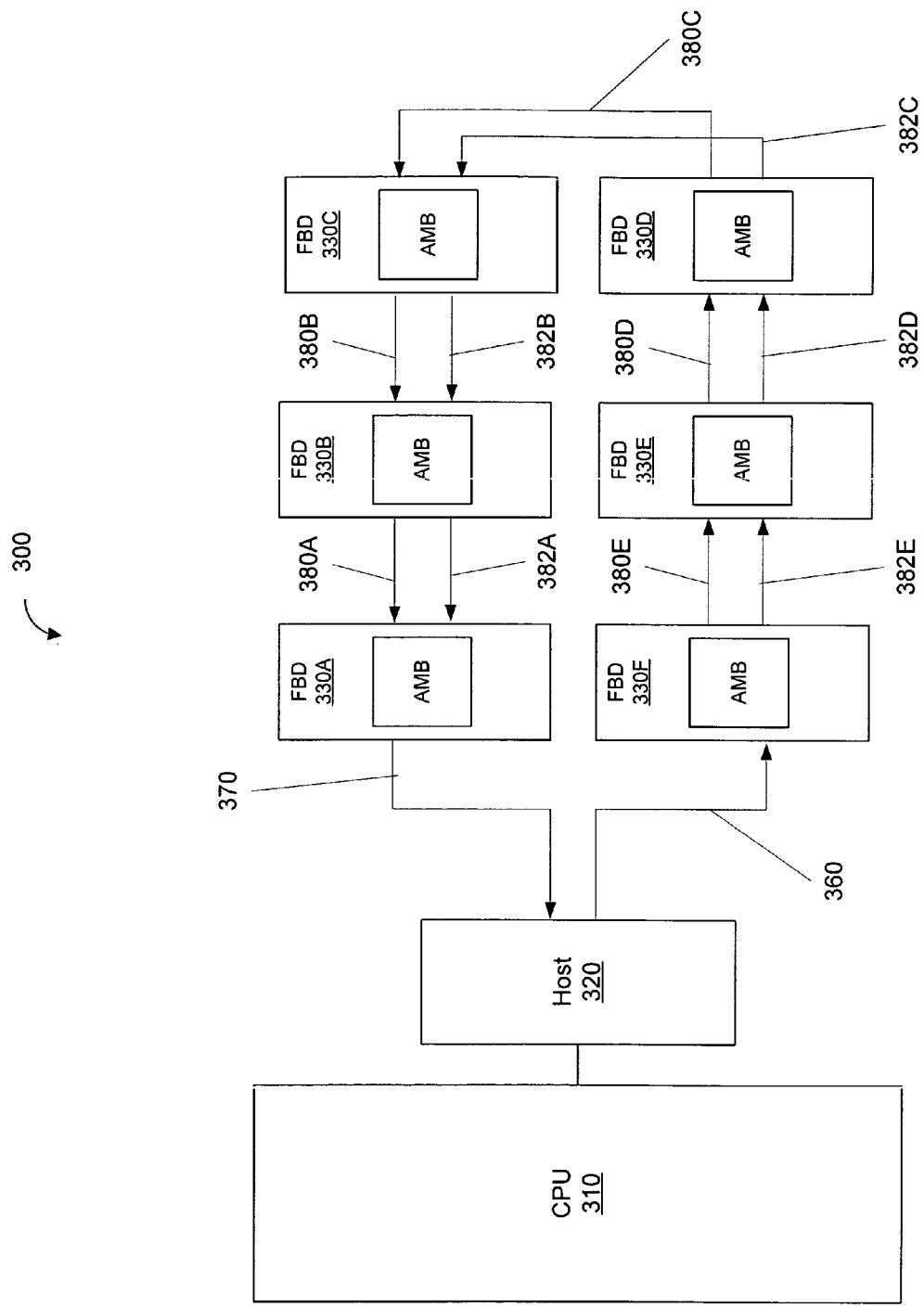
FIG. 3 is a block diagram of one embodiment of a memory subsystem.

In the embodiment of FIG. 2, channel routing is such that the host 220 sends downstream frames directly to the last FB-DIMM 230F and receives upstream frames directly from the first FB-DIMM 230A. In one embodiment, such an approach may be accomplished by laying out the FB-DIMMs 230 in a linear array with FB-DIMM 230F farthest from the host 220. Thus, the host 220 would send downstream packets over a relatively long link 260 to FB-DIMM 230F, but all other links (280, 282, 270) may be relatively short. In an alternative embodiment, FB-DIMMs may be laid out in a manner in which no upstream or downstream links are substantially longer than the others. FIG. 3 depicts an embodiment in which FB-DIMMs are laid out in such a way as to avoid having links which are substantially longer than the others.

In the example of FIG. 3, a system 300 is depicted wherein FB-DIMMS 330A-330F are physically arranged as two rows of three FB-DIMMS. Each of FB-DIMMs 330 may include a memory buffer (AMB) similar to that described in FIG. 2. As in FIG. 2, a host 320 is coupled to a CPU 310 and is configured to convey commands and write data directly to a "last" FB-DIMM 330F via a downstream link 360. As before, each of FB-DIMMs 330A-330E is coupled to a prior FB-DIMM via an upstream (380A-380E) and a downstream (382A-382E) link. FB-DIMM 330A is coupled to host 320 via upstream link 370. In the example shown, both FB-DIMM 330A and FB-DIMM 330F are arranged closest to the memory controller and may (though not necessarily) be approximately equidistant from the memory controller. As may be appreciated from the arrangement shown in FIG. 3, while all links are not necessarily equal in length, none are substantially longer than the others to the extent that link 260 is in FIG. 2. Accordingly, where it is desired (or necessary) to avoid a particularly long link, such an arrangement may be utilized.

Figure 4:
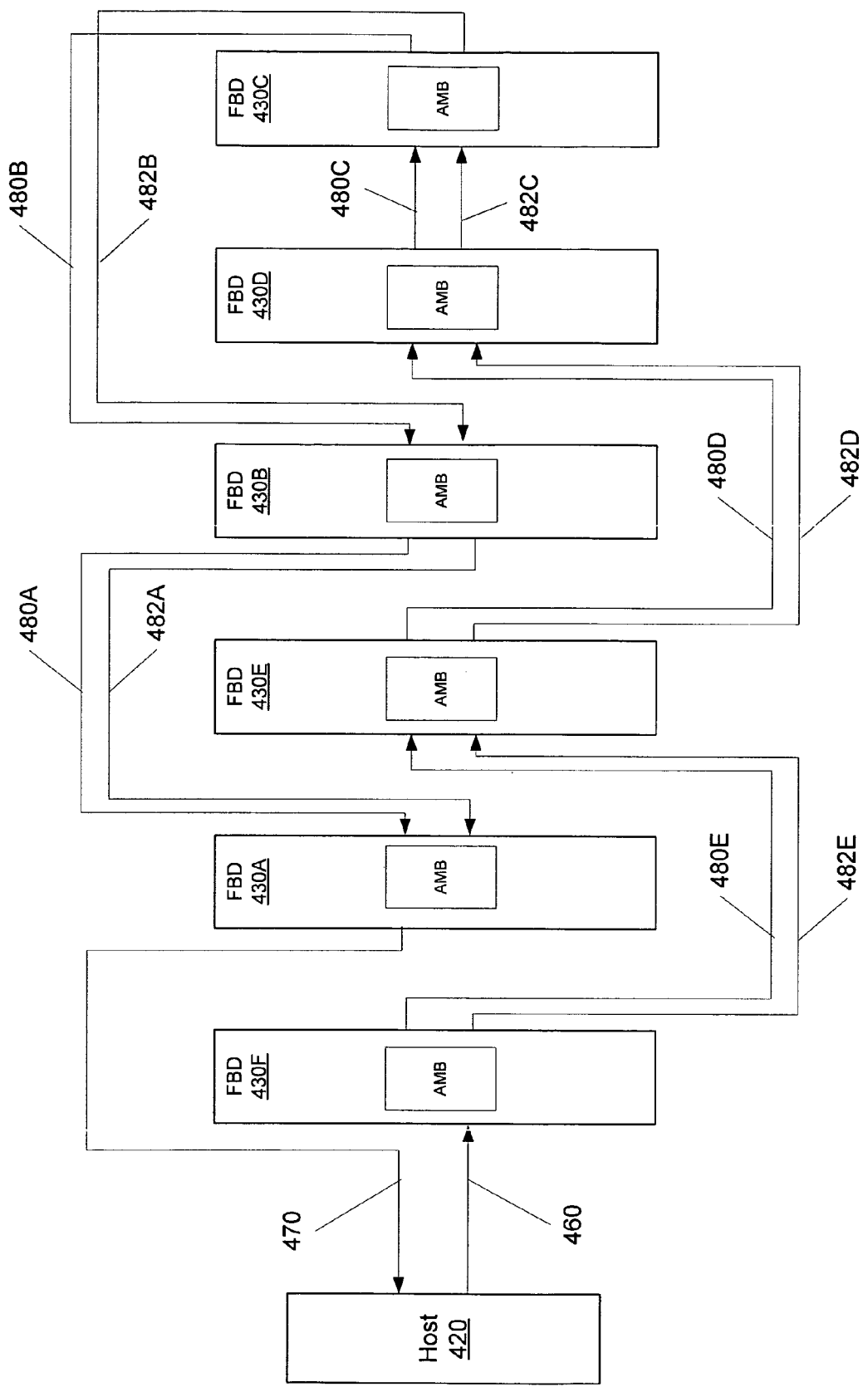
FIG. 4 is a block diagram of one embodiment of a memory subsystem.

FIG. 4 illustrates yet another approach wherein FB-DIMMs may be laid out to avoid large discrepancies in the length of interconnecting links. In the example shown, FB-DIMMs 430A-430F are arranged in a linear array ordered N, 1, N−1, 2, N−2, 3, N−3, 4, . . . , ceiling([N+1]/2), wherein N represents the "last" FB-DIMM 430F. In this example, as there are six FB-DIMMs illustrated, N=6. Accordingly, FB-DIMMs 430A-430F are ordered as N=1-6, respectively. Host 420 is coupled directly to FB-DIMM 430F via downstream link 460, and via upstream link 470 to FB-DIMM 430A. Each of FB-DIMMs 430A-430E is coupled to a prior FB-DIMM via an upstream (480A-480E) link and a downstream (482A-482E) link.

As can be seen in FIG. 4, none of links 480 or 482 are routed with a length as great at that shown for link 260 in FIG. 2 (assuming similar device dimensions). Accordingly, utilizing a layout similar to that shown in FIG. 4, all links may be relatively short. Of course, other layouts in addition to those depicted in FIGS. 2-4 are possible and are contemplated.

Figure 5:
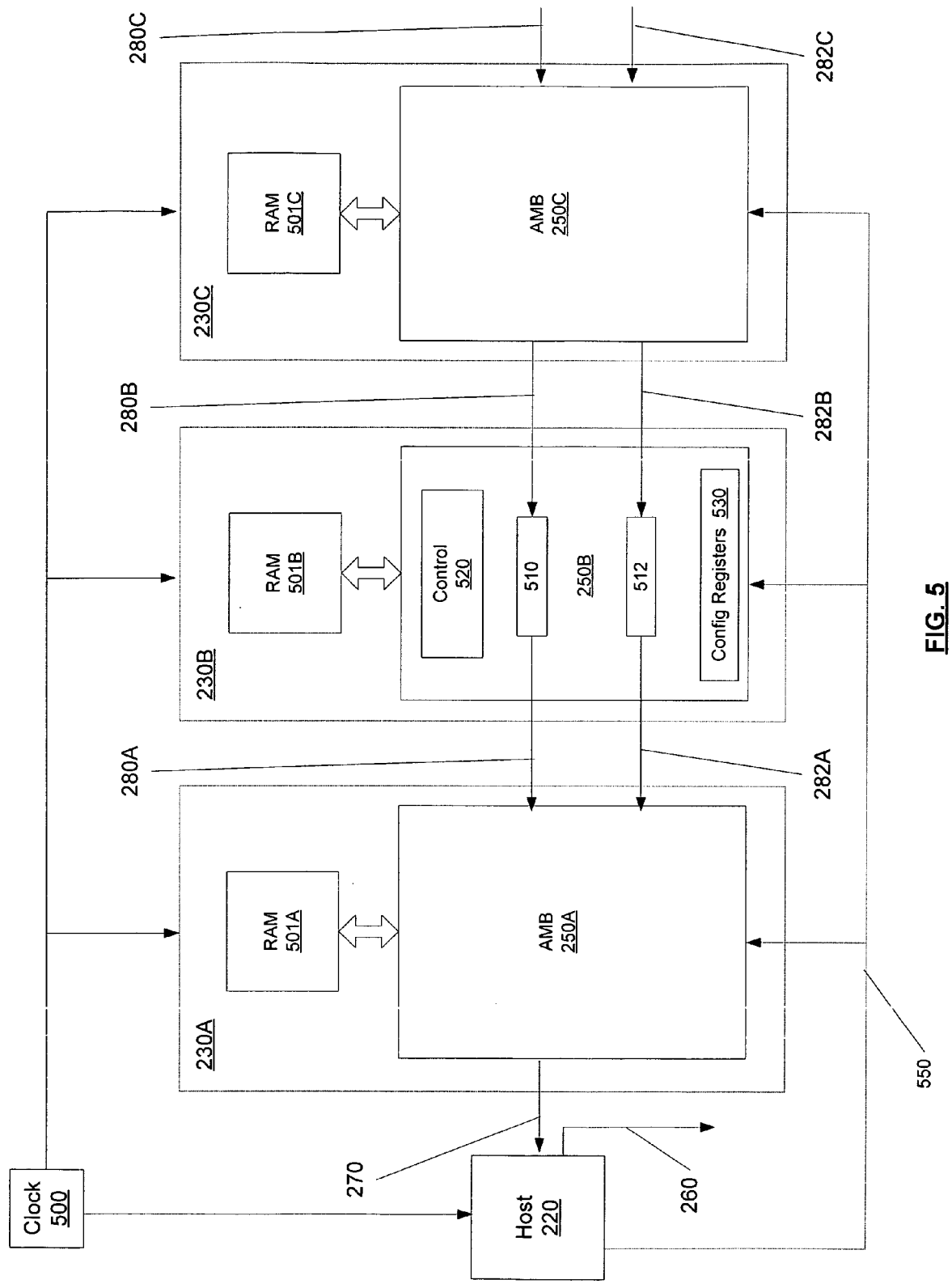
FIG. 5 illustrates one embodiment of a portion of a memory subsystem and memory buffer.

Turning now to FIG. 5, one embodiment of a portion of the memory subsystem of FIG. 2 is shown. FIG. 5 depicts host 220 and FB-DIMMs 230A-230C. Host 220 is coupled to convey commands and/or data via downstream link 260, and receive data via upstream link 270. Also shown is an optional system management bus 550 which may be used by host 220 to initialize of otherwise configure FB-DIMMs 230. Upstream links (280A-280C) and downstream links (282A-282C) are generally as described in FIG. 2. A clock signal conveyed from clock source 500 is also shown coupled to host 220 and each of FB-DIMMs 250.

As in FIG. 2, each of FB-DIMMs 230A-230C illustrated in FIG. 5 include a memory buffer 250A-250C, respectively. Also shown in FIG. 5 is random access memory (RAM) 501A-501C coupled to each of buffers 250A-250C. In one embodiment, the clock signals 500 may be used to generate the internal FB-DIMM buffer 250 clocks and clocks to RAM 501. FB-DIMM 230B is illustrated to show one embodiment of various units or components within buffer 250B. All of buffers 250 may be configured similar to that of buffer 250B. In the example shown, buffer 250 includes configuration registers 530, control unit 520, downstream logic 512, and upstream logic 510. In one embodiment, buffers 250B may be configured by writing predetermined values to configuration registers 530. Configuration may, for example, include an identification that the particular buffer corresponds to the last FB-DIMM on a channel. In various embodiments, configuration of buffers 250 may be accomplished via out-of-band transactions on bus 550, and/or in-band transactions on downstream links 282.

As described above, FB-DIMM 230B may receive command and/or write data frames via downstream link 282B. Additionally, FB-DIMM 230B may receive read data frames via upstream link 280B. Included in control unit 520 may be decode logic which is configured to determine the type of frame a received frame is and whether or not the frame is targeted to the receiving FB-DIMM. For example, in one embodiment, downstream frames may include two bits which indicates the frame includes a command. In addition, the two bits may further indicate whether the frame includes write data. Upstream frames may carry read data and/or status data, as well as other types of information. In one embodiment, and idle upstream frame may also be utilized. In one embodiment, the last FB-DIMM on a channel may be configured to generate idle upstream frames with a particular pattern when not sending requested read data. The pattern in such frames may enable the host 220 to distinguish idle frames from those containing read data. Other frame types and/or frame patterns may be utilized to indicate error conditions.

If it is determined a received downstream frame on link 282B is not targeted to the receiving buffer 250B, downstream logic 512 forwards the received frame to the next FB-DIMM 230A via downstream link 282A without acting upon it. If the receiving buffer 250B receives an upstream read data frame and has read data to return, control unit 520 may merge the read data into the received upstream frame and forward the frame to the next FB-DIMM 230A via upstream link 280A. It is noted that read and write transactions may include multiple frames and may also include CRC bits, or other error checking mechanisms.

Figure 6:
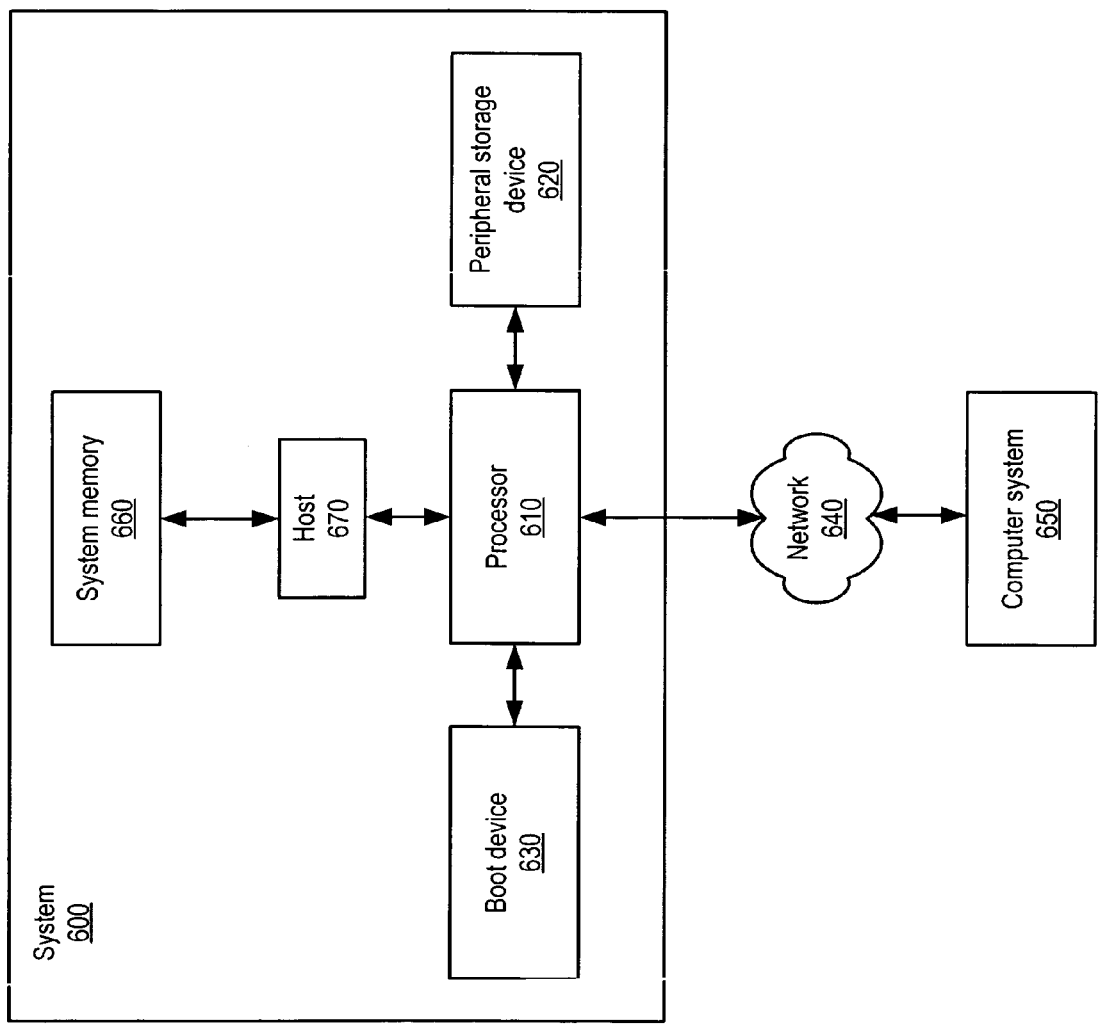
FIG. 6 illustrates one embodiment of computing system.

Turning now to FIG. 6, one embodiment of a system which incorporates a memory subsystem as described above is depicted. In the illustrated embodiment, system 600 includes processor 610 coupled to a host 670, boot device 630, peripheral storage device 620, and network 640. Network 640 is in turn coupled to another computer system 650. In some embodiments, system 600 may include more than one instance of the devices shown, such as more than one processor 610, for example. In various embodiments, system 600 may be configured as a rack-mountable server system, a standalone system, or in any other suitable form factor. In some embodiments, system 600 may be configured as a client system rather than a server system. While host 670 is depicted as a separate device, in other embodiments host 670 may be integrated with, or part of, processor 610. System memory 660 comprises FB-DIMMs as described above in an arrangement where host 670 is coupled directly to the last FB-DIMM via a downstream link.

Peripheral storage device 620, in various embodiments, may include support for magnetic, optical, or solid-state storage media such as hard drives, optical disks, nonvolatile RAM devices, etc. In some embodiments, peripheral storage device 620 may include more complex storage devices such as disk arrays or storage area networks (SANs), which may be coupled to processor 610 via a standard Small Computer System Interface (SCSI), a Fibre Channel interface, an IEEE 1394 interface, or another suitable interface. Additionally, it is contemplated that in other embodiments, any other suitable peripheral devices may be coupled to processor 610, such as multimedia devices, graphics/display devices, standard input/output devices, etc.

Boot device 630 may include a device such as an FPGA or ASIC configured to coordinate initialization and boot of processor 610, such as from a power-on reset state. Additionally, in some embodiments boot device 630 may include a secondary computer system configured to allow access to administrative functions such as debug or test modes of processor 610.

Network 640 may include any suitable devices, media and/or protocol for interconnecting computer systems, such as wired or wireless Ethernet, for example. In various embodiments, network 640 may include local area networks (LANs), wide area networks (WANs), telecommunication networks, or other suitable types of networks. In some embodiments, computer system 650 may be similar to or identical in configuration to illustrated system 600, whereas in other embodiments, computer system 650 may be substantially differently configured. For example, computer system 650 may be a server system, a processor-based client system, a stateless "thin" client system, a mobile device, etc.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory system comprising:
   a memory controller; and
   a plurality of memory modules including a first memory module and an Nth memory module, wherein each of the first through (N−1)th memory module is coupled to receive data from a same subsequent memory module via both an upstream link and a downstream link;
   wherein the memory controller is directly coupled to the Nth memory module by a downstream link and is directly coupled to the first memory module by an upstream link;
   wherein information sent from the memory controller to a particular memory module of said plurality of memory modules is conveyed directly to the Nth memory module through a downstream link and, as necessary, through additional downstream links to the particular memory module.

2. The memory system as recited in claim 1, wherein information conveyed from a given memory module of said plurality of memory modules to the memory controller is conveyed from the given memory module through upstream links to the memory controller.

3. The memory system as recited in claim 2, wherein each of the plurality of memory modules includes a buffer configured to buffer addresses, commands, and data.

4. The memory system as recited in claim 3, wherein each of the plurality of memory modules comprise a fully buffered dual inline memory module (FB-DIMM).

5. The memory system as recited in claim 3, wherein the plurality of memory modules are physically arranged as a single row of memory modules, wherein the first memory module is closest to the memory controller, and subsequent memory modules of the plurality of memory modules are increasingly further from the memory controller.

6. The memory system as recited in claim 3, wherein the plurality of memory modules are physically arranged as a single row of memory modules, and wherein the Nth memory module is closest to the memory controller.

7. The memory system as recited in claim 6, wherein the first memory module is second closest to the memory controller, and the (N−1)th memory module is third closest to the memory controller.

8. The memory system as recited in claim 3, wherein the plurality of memory modules are physically arranged as two rows of memory modules, wherein the first memory module and the Nth memory module are closest to the memory controller and are approximately equidistant from the memory controller.

9. The memory system as recited in claim 3, wherein read data is returned in an order in which it was requested by the memory controller.

10. The memory system as recited in claim 9, wherein upstream communication takes place by sending a pipelined sequence of fixed-size frames on upstream links, and wherein a memory module may update a content of a frame prior to forwarding the frame.

11. The memory system as recited in claim 3, wherein all commands and write data are conveyed via downstream links, and wherein all read data is conveyed via upstream links.

12. A method comprising:
    conveying information via a downstream link from a memory controller directly to an Nth memory module of a plurality of memory modules including a first memory module and the Nth memory module, wherein each of the first through (N−1)th memory module is coupled to receive data from a same subsequent memory module via both an upstream link and a downstream link; and
    receiving information via an upstream link at the memory controller directly from the first memory module of the plurality of memory modules.

13. The method as recited in claim 12, further comprising conveying information from a memory module of said plurality of memory modules to the memory controller by sending a pipelined sequence of fixed-size frames via upstream links.

14. The method as recited in claim 13, further comprising a memory module of the plurality of memory modules updating a content of a frame received via an upstream link prior to forwarding the frame via an upstream link.

15. The method as recited in claim 13, wherein each of the plurality of memory modules comprise a fully buffered dual inline memory module (FB-DIMM).

16. A computing system comprising:
    a processor;
    a plurality of memory modules including a first memory module and an Nth memory module, wherein each of the first through (N−1)th memory module is coupled to receive data from a same subsequent memory module via both an upstream link and a downstream link; and
    a memory controller coupled to the processor and the memory modules, wherein the memory controller is directly coupled to the Nth memory module by a downstream link and is directly coupled to the first memory module by an upstream link, and wherein information sent from the memory controller to a particular memory module of said plurality of memory modules is conveyed directly to the Nth memory module through a downstream link and, as necessary, through additional downstream links to the particular memory module.

17. The computing system as recited in claim 16, wherein information conveyed from a given memory module of said plurality of memory modules to the memory controller is conveyed from the given memory module through upstream links to the memory controller.

18. The memory system as recited in claim 17, wherein each of the plurality of memory modules comprise a fully buffered dual inline memory module (FB-DIMM).

19. The memory system as recited in claim 17, wherein the plurality of memory modules are physically arranged as a single row of memory modules, wherein the first memory module is closest to the memory controller.

20. The memory system as recited in claim 17, wherein the plurality of memory modules are physically arranged as a single row of memory modules, and wherein the Nth memory module is closest to the memory controller.

* * * * *